United States Patent
Shu

(10) Patent No.: US 8,929,051 B2
(45) Date of Patent: *Jan. 6, 2015

(54) APPARATUS AND METHOD FOR HOLDING A WAFER

(71) Applicant: Emily Shu, Shanghai (CN)

(72) Inventor: Emily Shu, Shanghai (CN)

(73) Assignee: Semiconductor Manufacturing International Corp., Shanghai (CN)

(*) Notice: Subject to any disclaimer, the term of this patent is extended or adjusted under 35 U.S.C. 154(b) by 0 days.

This patent is subject to a terminal disclaimer.

(21) Appl. No.: 13/649,686

(22) Filed: Oct. 11, 2012

(65) Prior Publication Data
US 2013/0100573 A1    Apr. 25, 2013

(30) Foreign Application Priority Data
Oct. 19, 2011 (CN) .......................... 2011 1 0319210

(51) Int. Cl.
*H01T 23/00* (2006.01)
*H01L 21/67* (2006.01)
*H01L 21/683* (2006.01)

(52) U.S. Cl.
CPC ...... *H01L 21/67288* (2013.01); *H01L 21/6833* (2013.01)

USPC .......................................................... 361/234

(58) Field of Classification Search
USPC .......................................................... 361/234
See application file for complete search history.

(56) References Cited

U.S. PATENT DOCUMENTS

| 5,872,694 A * | 2/1999 | Hoinkis et al. ............... 361/234 |
| 2010/0093161 A1* | 4/2010 | Kusumoto et al. ............ 438/522 |
| 2010/0277850 A1* | 11/2010 | Chang et al. ................... 361/234 |

* cited by examiner

*Primary Examiner* — Stephen W Jackson
(74) *Attorney, Agent, or Firm* — Anova Law Group, PLLC

(57) ABSTRACT

An apparatus and a method for holding a wafer are provided in this disclosure. The wafer holding apparatus includes: an electrostatic chuck which has a plurality of zones arranged in a matrix; a plurality of power supply units, each of which is adapted to apply a voltage to the plurality of zones of the electrostatic chuck independently; and a control unit which is adapted to control each of the power supply units independently to start or stop applying the voltage to a corresponding zone of the electrostatic chuck. Surface flatness is improved when the wafer is chucked on the wafer holding apparatus according to the disclosure, and the risk of particles contamination can be reduced when the wafer is flattened and gets back into warpage from flatness.

15 Claims, 8 Drawing Sheets

APPARATUS AND METHOD FOR HOLDING A WAFER

CROSS REFERENCE TO RELATED APPLICATIONS

The present application claims the priority of Chinese Patent Application No. CN201110319210.3, entitled "Apparatus and Method for Holding a Wafer" and filed on Oct. 19, 2011, the entire disclosure of which is incorporated herein by reference.

FIELD OF THE INVENTION

The present disclosure generally relates to semiconductor manufacturing technology and, more particularly, relates to apparatus and methods for holding a wafer.

BACKGROUND

According to Moore's Law, the number of transistors per silicon chip doubles every 18 months, and the sizes of devices decrease in proportion to a factor of approximately 0.7 every three years.

Larger wafers hold more chips and can reduce per-chip cost. 300 mm wafers are now commonly used in semiconductor manufacturing processes and the industry is pushing for an even larger wafer size of 450 mm in diameter.

Although the wafers having large sizes, such as 300 mm, 450 mm, or even larger, can be used to reduce manufacturing cost, larger wafers introduce new issues that were not previously considered in smaller wafers. One critical issue is the wafer warpage which has become more severe with 300 mm or larger wafers.

Wafer warpage causes many undesired manufacturing defects. For example, a spun-on layer on the wafer may have a larger thickness at the centre than the outer edge. In an etching process, critical dimension (CD) uniformity problem from wafer center to edge at least partly comes from imperfect chucking over wafer warpage. And in a photolithographic process, a photoresist (PR) layer's thickness uniformity from wafer centre to outer edge is critical. During exposure, wafer warpage induced focus drift can be disastrous for CD uniformity.

An electrostatic chuck (also referred to as ESC or E-chuck) is often employed to solve the problem of wafer warpage in the semiconductor manufacturing process. However, an electrostatic chuck often suffers from chucking uniformity and particle contamination while performing a flattening process on the wafer. Therefore, there is a need to provide methods for avoiding undesired effects in wafer chucking.

SUMMARY

Embodiments of the present disclosure provide an apparatus and a method for holding a wafer to reduce the risk of particle contamination in an electrostatic chuck.

One embodiment of the present disclosure provides a wafer holding apparatus. The wafer holding apparatus includes an electrostatic chuck, a plurality of power supply units and a control unit. The electrostatic chuck has a plurality of zones arranged in a matrix. Each of the power supply units is adapted to apply a voltage to a corresponding one of the plurality of zones of the electrostatic chuck independently. And the control unit is adapted to control each of the plurality of power supply units independently to start or stop applying the voltage to a corresponding zone of the electrostatic chuck. The starting voltage is increased gradually or in steps. And the stopping voltage is applied gradually or in steps.

Another embodiment of the present disclosure provides a method for holding a wafer. The method includes the following steps. A wafer is provided and an electrostatic chuck which has a plurality of zones arranged in a matrix is provided. A control unit is provided which is capable of independently controlling each of the zones of the electrostatic chuck. Then the wafer flatness data is obtained. And the control unit selects a holding or release pattern for each of the zones of the electrostatic chuck independently based on the wafer flatness data to reduce the chucked wafer warpage.

Compared with the prior art, embodiments of this disclosure have the following advantages:

The control unit may control each of the plurality of power supply units independently to start or stop applying the relevant voltage, and to select a power supply mode to start or stop applying voltage based on the practical requirements. Therefore, the wafer will become flattened and then return into a warpage state smoothly, which consequently reduces the risk of particle contamination from wafer backside scratching with the e-chuck in the course of flattening and regaining warpage.

The electrostatic chuck has a plurality of zones arranged in a matrix, which allows the control unit to control the plurality of power supply units in an appropriate order, such as a serpentine order, a winding order, a diagonal order, or a waterfall-like order, to start or stop applying voltage to the relevant zones. The wafer can get flattened or recover back to a warpage state in small steps and smoothly. Therefore, the risk of particle contamination from wafer backside scratching with the e-chuck is reduced. Not only chucked wafer is flattened, manufacturing yield can be improved as well.

The method for holding a wafer according to one embodiment of the present disclosure can select a release pattern independently to release the wafer for each of the plurality of zones of the electrostatic chuck based on the wafer flatness data, so that the wafer is released smoothly and gradually, which avoids particle contamination because the wafer changes its status from flatness to warpage instantly.

DETAILED DESCRIPTION OF THE INVENTION

Figure 1:
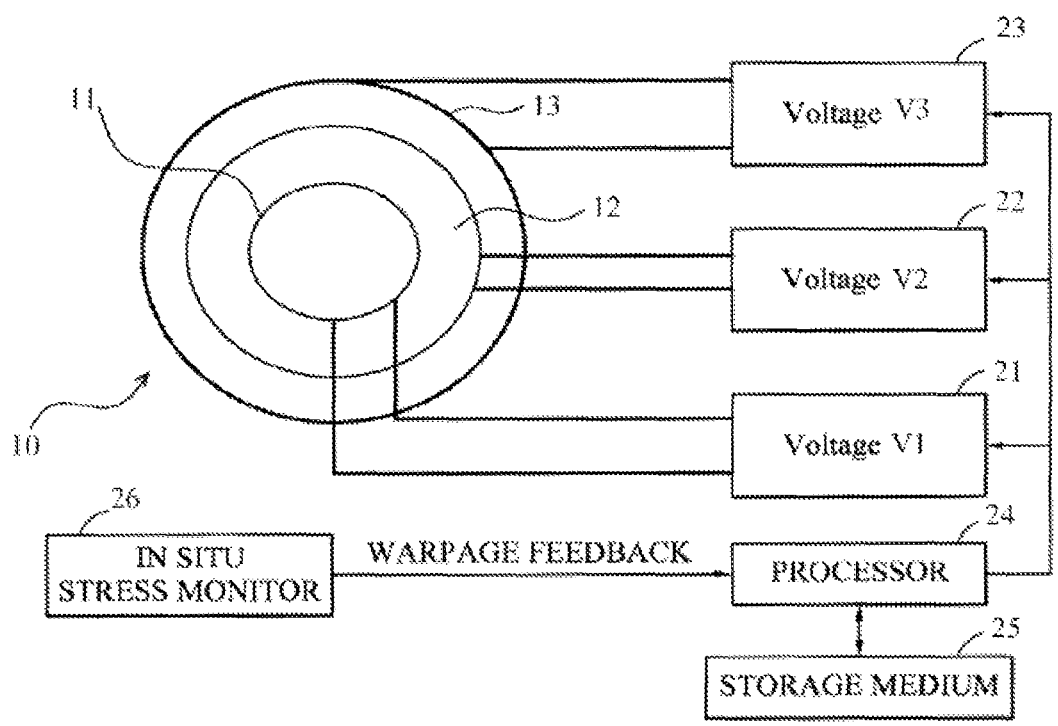
FIG. 1 is a schematic top-view of a conventional electrostatic chuck.
Figure 2:
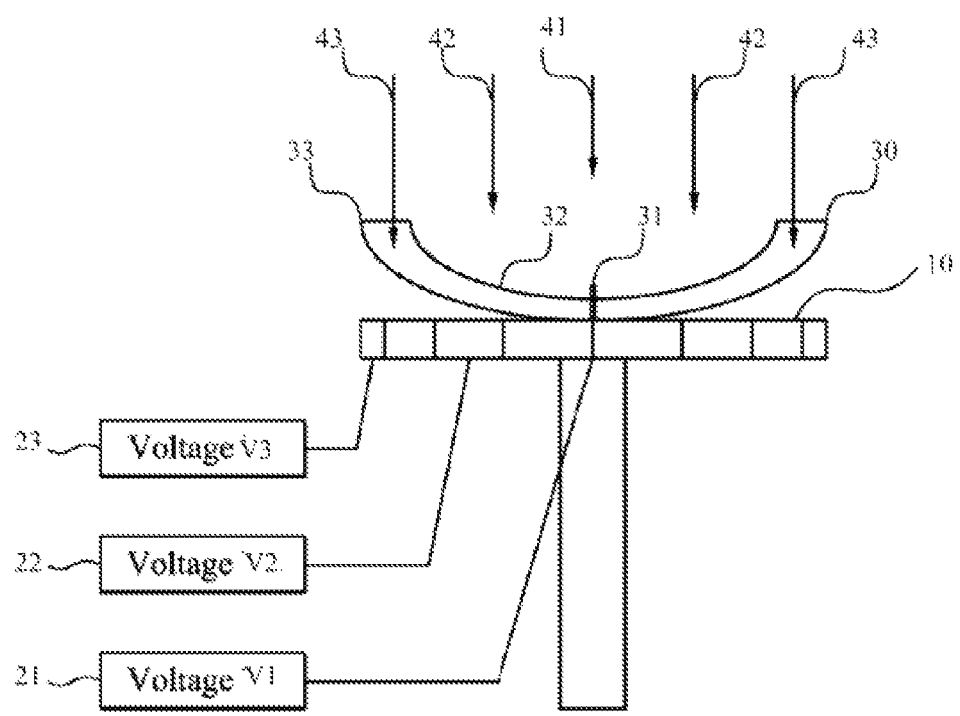
FIG. 2 is a schematic cross-sectional view illustrating the electrostatic chucking process of FIG. 1.

An electrostatic chuck is often employed to solve the problem of wafer warpage in the semiconductor manufacturing process. FIGS. 1 and 2 show an electrostatic chuck 10 that includes: a center zone 11; an outer zone 13; an intermediate zone 12 between the center zone 11 and the outer zone 13; a voltage supply 21 for applying V1 to the center zone 11; a voltage supply 22 for applying V2 to the intermediate zone 12; and a voltage supply 23 for applying V3 to the outer zone 13. The voltage V2 is greater than the voltage V1, but less than the voltage V3. Further, the electrostatic chuck 10 includes a processor 24 configured to control the voltage supplies 21, 22, and 23; a storage medium 25 connected to the processor 24; and a stress monitor 26 configured to measure an amount of warpage and send the data representing the amount of warpage to the processor 24.

Referring to FIG. 2, when a wafer 30 is placed on the electrostatic chuck 10, the stress monitor 26 (shown in FIG. 1) measures the amount of warpage of the wafer 30 by measuring heights of a top surface of the wafer at a plurality of points on the surface, such as a center point 31, an intermediate point 32, and an outer point 33. Then the data representing the amount of warpage is fed back to the processor 24 in FIG. 1. Based on the warpage data, the processor 24 controls the voltage supplies 21, 22, and 23 to apply an force 41 at the center, an intermediate force 42 between the center and the outer edge, and a force 43 near the outer edge of the wafer 30 respectively, wherein the intermediate force 42 is greater than the force 41 at the center, but less than the force 43 at the outer edge, so as to flatten the wafer 30.

During a chucking process, a control system of an electrostatic chuck (e.g., processor 24 shown in FIG. 1) will turn on and off voltage supplies for all electrostatic zones, e.g., voltage supply 21 for V1, voltage supply 22 for V2, and voltage supply 23 for V3 described above, to flatten and to release warped wafers. Many particles are generated in the process from scratches made from chuck and wafer contact, and particles drop on the wafer surface cause particle contamination.

Figure 3:
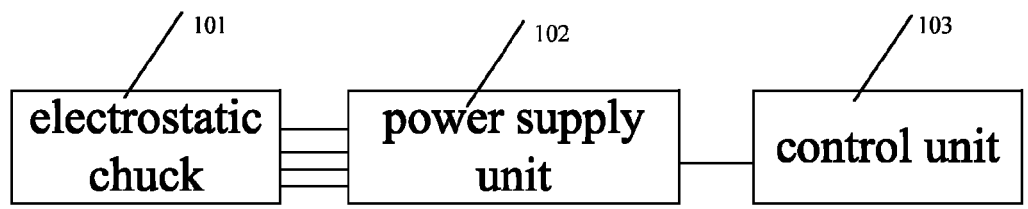
FIG. 3 is a schematic block view of an electrostatic chuck, its power supply and control unit according to an embodiment of the present disclosure.

To solve these problems, an apparatus for holding a wafer is provided according to one embodiment of the present disclosure. Referring to FIG. 3, the wafer holding apparatus includes an electrostatic chuck 101, a plurality of power supply units 102 and a control unit 103. The electrostatic chuck 101 has a plurality of zones arranged in a matrix. Each of the power supply units 102 is adapted to apply a voltage to the plurality of zones of the electrostatic chuck independently. And the control unit 103 is adapted to control each of the plurality of power supply units independently to start or stop applying the voltage to a corresponding zone of the electrostatic chuck. The starting voltage is increased gradually or in steps. And the stopping voltage is applied gradually or in steps.

Various embodiments of the present disclosure have the following advantages. The control unit may control each of the plurality of power supply units independently to start or stop applying the relevant voltages, and to select a power supply mode to start or stop applying voltages based on the practical requirements. Therefore, the wafer may become flattened and then return into a warpage state smoothly, which consequently reduces the risk of particle generation from the chuck and wafer back surface scratch in the course of flattening and regaining warpage.

The electrostatic chuck has a plurality of zones arranged in a matrix, which allows the control unit to control the plurality of power supply units in an appropriate order, such as a serpentine order, a winding order, a diagonal order, or a waterfall-like order, to start or stop applying a voltage to the relevant zone. The wafer can get flattened or recover back into a warpage state in small steps and smoothly. Therefore, the risk of particle generation from wafer backside scratching with the e-chuck is reduced. Not only chucked wafer is flattened, manufacturing yield is improved as well.

Figure 4:
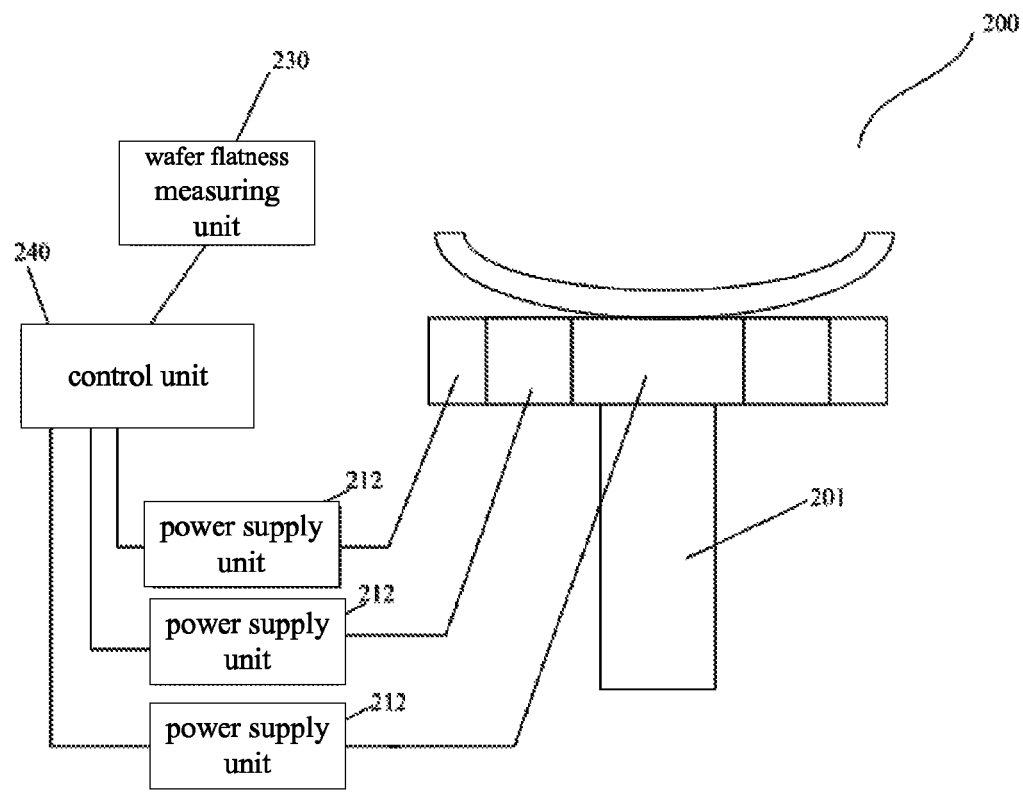
FIG. 4 is a schematic illustrating an electrostatic chuck for holding a wafer according to an embodiment of the present disclosure.

The wafer holding apparatus will be described in detail with reference to specific embodiments. Referring to FIG. 4, a wafer holding apparatus 200 includes: an electrostatic chuck 201, a plurality of power supply units 212, a wafer flatness measuring unit 230, and a control unit 240.

Electrostatic chuck 201 serves to hold a wafer. In the case that the power supply units provide a voltage, Coulomb force or Johnsen-Rahbek force can be generated between the wafer and electrodes in electrostatic chuck 201 to fix or chuck the wafer.

Electrostatic chuck 201 includes a base, electrodes in the base, and an insulating layer (chuck details not shown). The base is configured to support the electrodes and the insulating layer. Being powered by the power supply units 212, the electrodes serve to generate Coulomb force or Johnsen-Rahbek force between the wafer and the electrodes in electrostatic chuck 201. The insulating layer forms a dielectric between the electrodes and the wafer.

As an example, the base may be connected to a radio frequency (RF) bias which serves as a heater or a cooler for the wafer.

As an example, electrostatic chuck 201 may have a circular shape slightly larger than the wafer. Optionally, electrostatic chuck 201 may have a square or rectangular shape, but the present disclosure is not limited thereto.

The electrostatic chuck 201 may have a plurality of zones arranged in a matrix of M×N zones, where M and N are natural numbers greater than 1.

Figure 5:
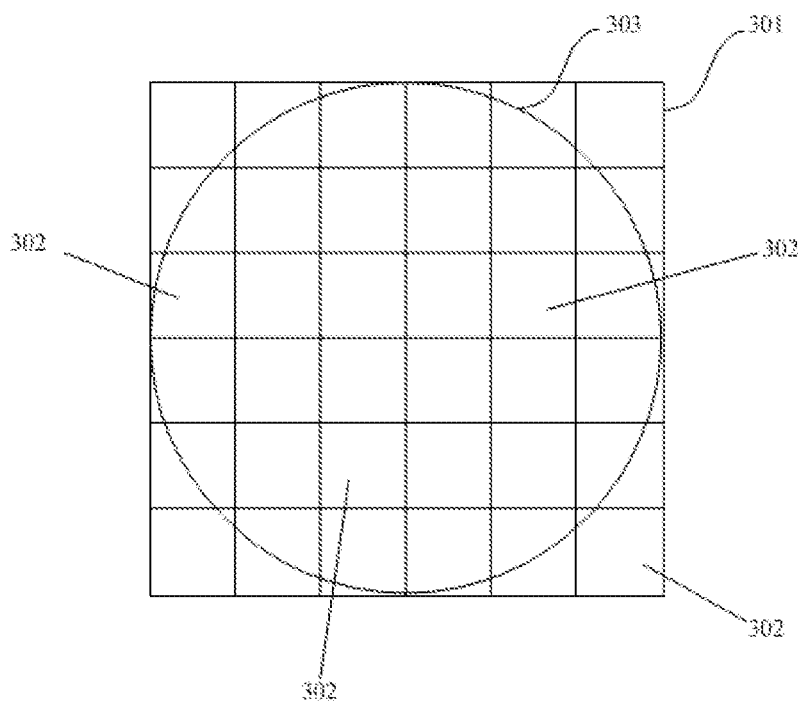
FIG. 5 is a schematic view illustrating zones arranged on an exemplary electrostatic chuck for holding a wafer according to an embodiment of the present disclosure.

If M=N, the chuck is a square. FIG. 5 shows an electrostatic chuck 301 which has 6×6 zones 302 arranged in a square matrix. A wafer 303 is placed on the surface of electrostatic chuck 301.

Figure 6:
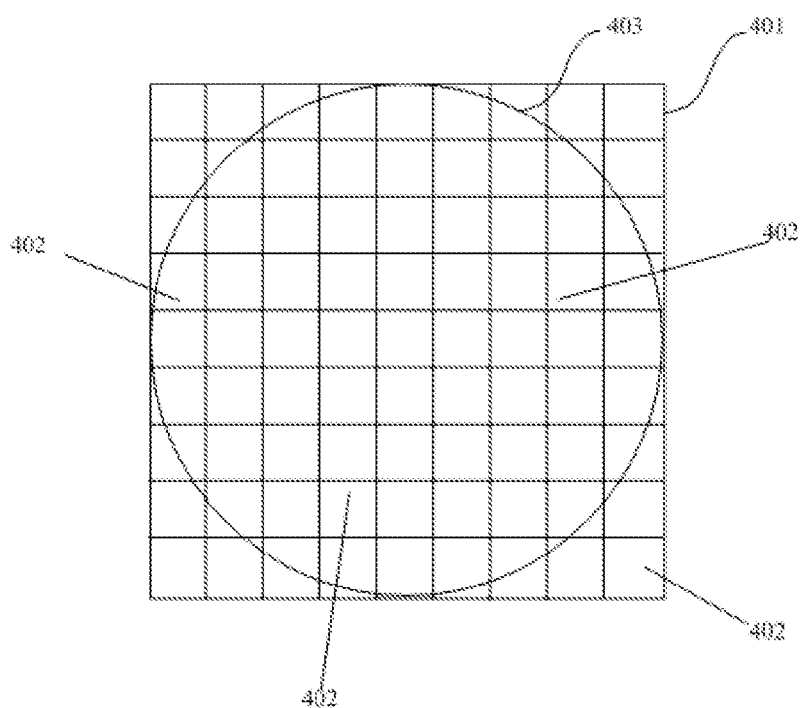
FIG. 6 is a schematic view illustrating zones arranged on another exemplary electrostatic chuck for holding a wafer according to an embodiment of the present disclosure.

In another example, an electrostatic chuck 401 having a 9×9 matrix of zones 402 is shown in FIG. 6, and the total 81 zones 402 constitute the electrostatic chuck. A wafer 403 is placed on the surface of electrostatic chuck 401.

It should be noted that the more zones an electrostatic chuck has, typically the better chucking effect the chuck can achieve. First, a better wafer flatness may be achieved. Secondly, the wafer may be chucked and de-chucked by the electrostatic chuck more smoothly.

In addition, the electrostatic chuck may have various zones arranged in a matrix, such as 7×9, 8×11, 15×17, 2×2, 27×9, 38×41, 25×17 and 12×45. The size of each zone may be the same or different. Optionally, the size of each zone in the matrix may be configured based on the typical wafer warpage resulting from process, so that a desired effect of holding the wafer by the electrostatic chuck will be achieved.

Referring to FIG. 4, the plurality of power supply units 212 correspond to the plurality of zones of the electrostatic chuck in a one-to-one manner. Each power supply unit 212 is electrically connected to one of the zones of the electrostatic chuck, and controls the zones to generate Coulomb force in a Coulomb chuck or Johnsen-Rahbek force in a J-R chuck, in order to hold the wafer on the electrostatic chuck tightly.

It should be noted that each power supply unit 212 may be operated independently, and voltages applied by the power supply units 212 may be adjusted independently within an adjustable limit without influencing the other power supply units.

Optionally, the plurality of power supply units 212 may apply voltages to the zones of electrodes synchronously or asynchronously.

Figure 7:
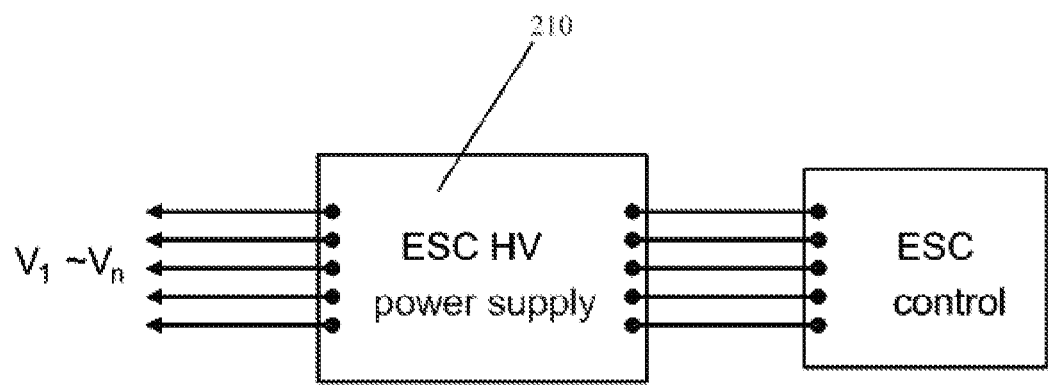
FIG. 7 is a schematic block view of a power supply unit of an electrostatic chuck for holding a wafer according to an embodiment of the present disclosure.

Referring to FIG. 7, voltages V1~Vn may be supplied to the plurality of zones of the electrostatic chuck independently by the plurality of power supply units 212, and each of the plurality of zones may generate Coulomb force if it is a Coulomb chuck or Johnsen-Rahbek force if it is a J-R chuck, so that a warped wafer may be held by the electrostatic chuck tightly and be flattened.

It should be noted that the number of the plurality of power supply units 212 depends on the number of the plurality of zones of the electrostatic chuck. For example, if the electrostatic chuck has 6×6 zones, the number of the plurality of power supply units is 36 correspondingly. And if the electrostatic chuck has 9×9 zones, the number of the plurality of power supply units is 81 correspondingly.

Referring to FIG. 4, the wafer flatness measuring unit 230 is configured to measure flatness, warpage, and profile of a wafer. The wafer flatness measuring unit 230 may be an optical scanning device, a stress monitor device, or an optical interferometer.

A wafer flatness measuring unit 230 includes an optical scanning unit, a receiver, and a processor (not shown). The scanning unit scans the wafer loaded on the electrostatic chuck. The scanning unit may be a digital camera, a high-precision scanner, or a high-precision camera. Taking the optical interferometer as an example, the optical interferometer measures the wafer front surface, thus the chucked wafer flatness data is received by the processor.

A digital camera, a high-precision scanner, or an optical interferometer may be employed as the scanning unit, and the scanning unit acquires position data of the wafer loaded on the electrostatic chuck and transmits the position data to the processor. The position data reflects the flatness of the loaded wafer.

After obtaining the flatness data of the loaded wafer, wafer flatness measuring unit 230 transmits the flatness data to control unit 240. Control unit 240 is configured to direct each of the plurality of power supply units 212 to start or stop applying voltages at appropriate times to corresponding zones. And control unit 240 controls each of the plurality of power supply units 212 independently.

Control unit 240 may control each of the plurality of power supply units 212 independently based on the flatness data of the loaded wafer, and select a power supply mode which matches with the flatness data to start or stop applying a voltage to a corresponding zone.

Figure 8:
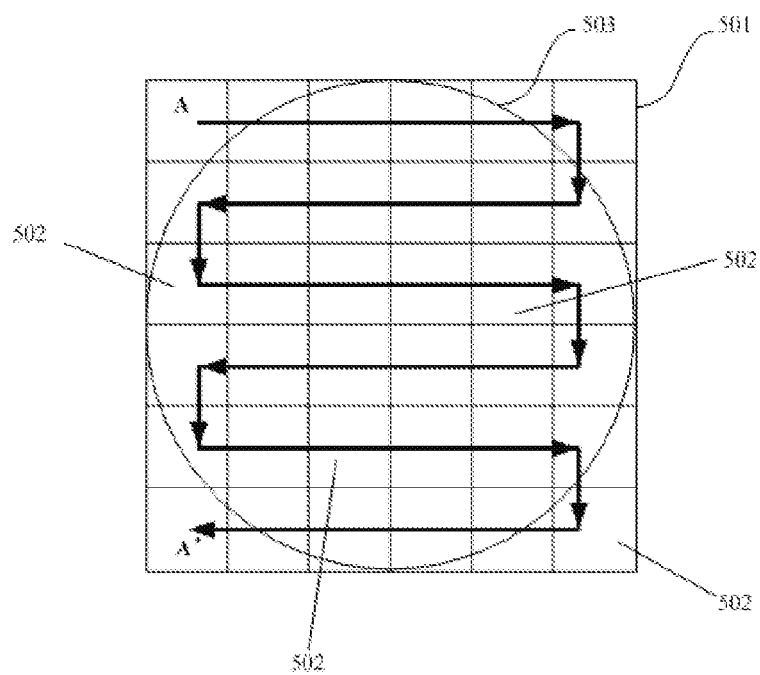
FIG. 8 is a schematic view illustrating the turning-on sequence in a serpentine order of various zones in the electrostatic chuck according to an embodiment of the present disclosure.

As an example, referring to FIG. 8, the control unit (not shown in the drawing) is configured to control each of the plurality of power supply units (not shown in the drawing) to start increasing voltage to corresponding zones 502 in a serpentine order sequentially, so that the electrostatic chuck holds the wafer smoothly and gradually in the serpentine order. Specifically, by taking an electrostatic chuck 501 arranged in a 6×6 matrix as an example, the control unit controls each the power supply unit in a direction of AA' or A'A to start increasing voltage to 6×6 zones 502 sequentially. By doing this, the 6×6 zones 502 start generating binding force sequentially in the serpentine order, so that electrostatic chuck 501 holds wafer 503 tightly in the serpentine order.

Also referring to FIG. 8, the control unit (not shown in the drawing) is configured to control each of the power supply units (not shown in the drawing) to reduce or stop applying voltage to corresponding zones 502 in the serpentine order sequentially, so that the electrostatic chuck releases the wafer in the serpentine order. Specifically, taking an electrostatic chuck 501 arranged in a 6×6 matrix as an example, the control unit controls each power supply unit in either direction of AA' or A'A to reduce or stop applying voltage to the 6×6 zones sequentially. By doing this, the 6×6 zones stop generating binding force sequentially in the serpentine order, so that electrostatic chuck 501 releases wafer 503 in the serpentine order.

Figure 9:
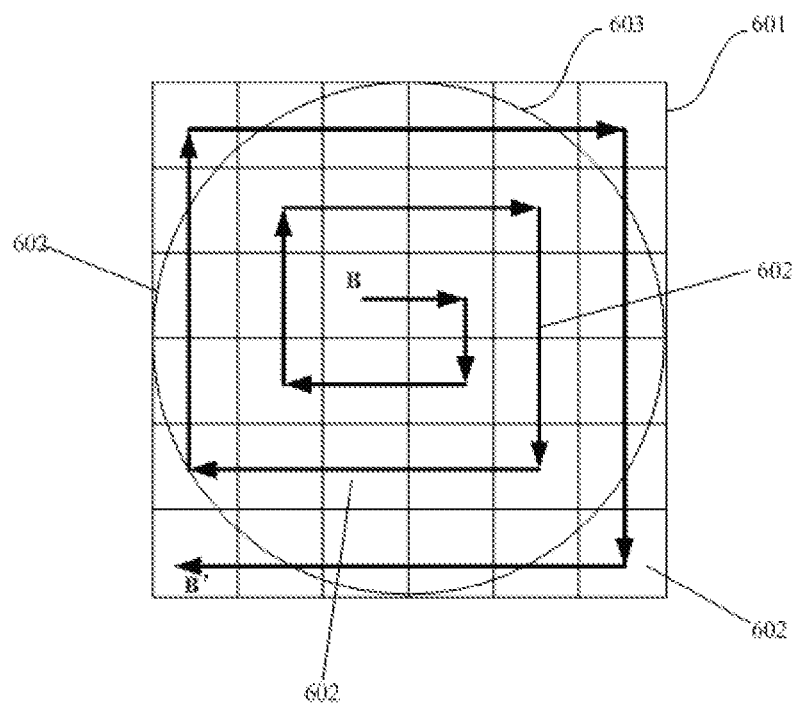
FIG. 9 is a schematic view illustrating the turning-on sequence in a winding order of various zones in the electrostatic chuck according to an embodiment of the present disclosure.

As another example, referring to FIG. 9, the control unit (not shown in the drawing) is configured to control each of the power supply units (not shown in the drawing) to start increasing voltage to corresponding zones 602 in a winding order sequentially, so that the electrostatic chuck holds the wafer smoothly and gradually in the winding order. Specifically, by taking an electrostatic chuck 601 arranged in a 6×6 matrix, the control unit controls each power supply unit in a direction of BB' or B'B to start increasing voltage to 6×6 zones sequentially. By doing this, the 6×6 zones start generating binding force sequentially in a winding order, so that electrostatic chuck 601 holds wafer 603 smoothly in a winding order.

Also referring to FIG. 9, the control unit (not shown in the drawing) is configured to control each of the power supply units (not shown in the drawing) to reduce or stop applying voltage to corresponding zones 602 in the winding order sequentially, so that the electrostatic chuck releases the wafer in the winding order. Specifically, taking an electrostatic chuck 601 having 6×6 zones as an example, the control unit controls each power supply unit in either direction of BB' or B'B to reduce or stop applying voltage to 6×6 zones 602 sequentially. By doing this, the 6×6 zones stop generating binding force sequentially in a winding order, so that electrostatic chuck 601 releases wafer 603 in a winding order.

Figure 10:
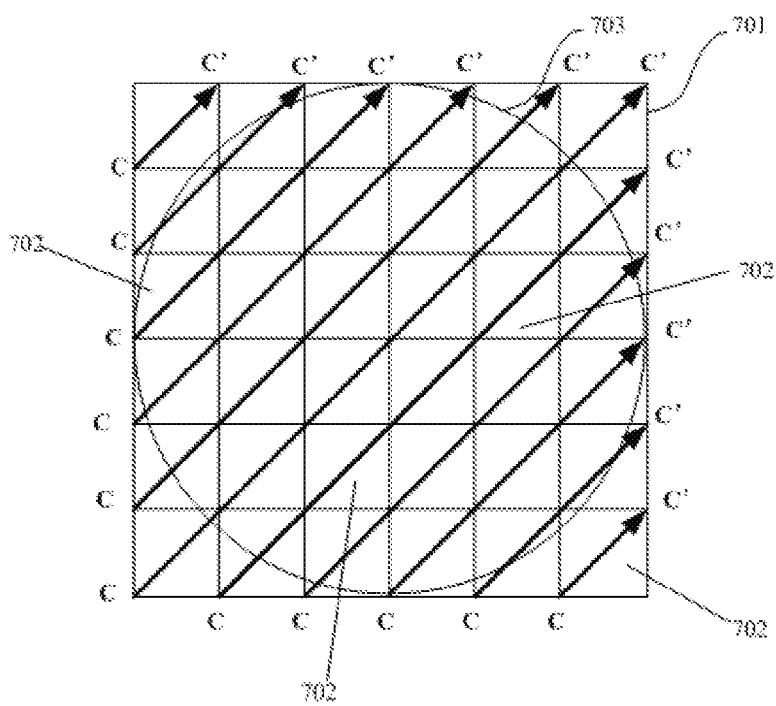
FIG. 10 is a schematic view illustrating the turning-on sequence in a diagonal order of various zones in the electrostatic chuck according to an embodiment of the present disclosure.

As another example, referring to FIG. 10, the control unit (not shown in the drawing) is configured to control each of the power supply units (not shown in the drawing) to start increasing voltage to corresponding zones 702 in a diagonal order starting from one corner of the chuck sequentially, so that the electrostatic chuck holds the wafer smoothly and gradually in the diagonal order. Specifically, taking an electrostatic chuck 701 arranged in a 6×6 zones matrix as an example, the control unit controls each the power supply unit in a direction of CC' or C'C to start increasing voltage to 6×6 zones 702 sequentially. By doing this, the 6×6 zones start generating binding force sequentially in a diagonal order, so that electrostatic chuck 701 holds wafer 703 smoothly in a diagonal order.

Similarly, referring to FIG. 10, the control unit (not shown in the drawing) is configured to control each of the power supply units (not shown in the drawing) to reduce or stop applying voltage to corresponding zones 702 in a diagonal order sequentially, so that the electrostatic chuck releases the wafer in a diagonal order. Specifically, taking an electrostatic chuck 701 arranged in a 6×6 zones matrix as an example, the control unit controls each power supply unit in either direction of CC' or C'C to reduce or stop applying voltage to 6×6 zones 702 sequentially. By doing this, the 6×6 zones 702 stop generating binding force sequentially in a diagonal order, so that electrostatic chuck 701 releases wafer 703 in a diagonal order.

Figure 11:
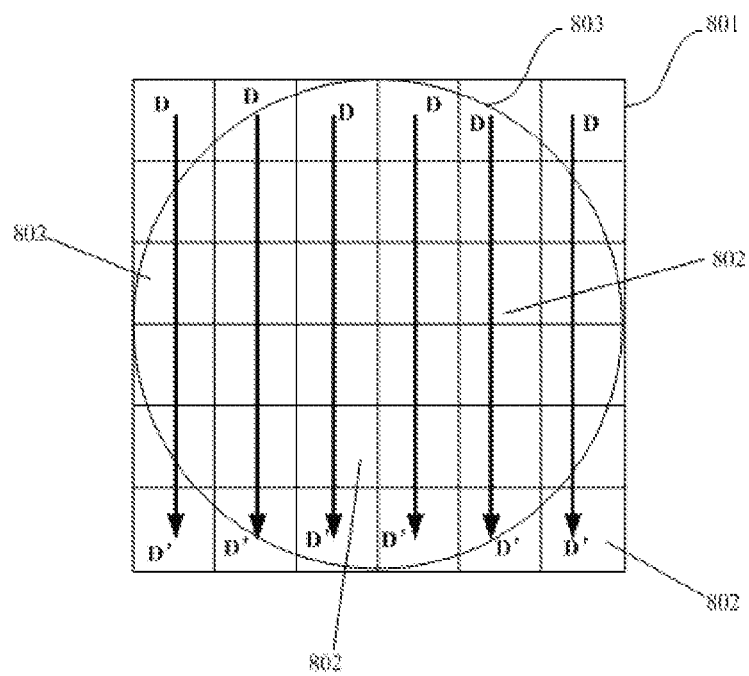
FIG. 11 is a schematic view illustrating the turning-on sequence in a waterfall-like order of various zones in the electrostatic chuck according to an embodiment of the present disclosure.

Referring to FIG. 11, the control unit (not shown in the drawing) is configured to control each of the power supply units (not shown in the drawing) in a waterfall-like order to start increasing voltage to corresponding zones 802 sequentially starting from one side of the wafer 803, such that the electrostatic chuck holds the wafer smoothly and gradually in a waterfall-like order. Specifically, by taking an electrostatic chuck 801 arranged in a 6×6 matrix as an example, the control unit controls each power supply unit in a direction of DD' or D'D line to start increasing voltage to 6×6 zones 802 sequentially. By doing this, the 6×6 zones 802 start generating binding force gradually and smoothly in a waterfall-like order, so that the electrostatic chuck 801 holds wafer 803 smoothly and tightly in a waterfall-like order.

Referring to FIG. 11, the control unit (not shown in the drawing) is configured to control each of the power supply units (not shown in the drawing) to reduce or stop applying voltage to corresponding zones 802 in a waterfall-like order sequentially, so that the electrostatic chuck releases the wafer in a waterfall-like order. Specifically, by taking an electrostatic chuck 801 arranged in a 6×6 matrix 802 as an example, the control unit controls each power supply unit in either direction of DD' or D'D line to reduce or stop applying voltage to 6×6 zones 802 sequentially. By doing this, 6×6 zones 802 stop generating binding force sequentially in a waterfall-like order, so that electrostatic chuck 801 releases wafer 803 in a waterfall-like order.

If the wafer held by the electrostatic chuck shows a poor flatness, the control unit can control each of the power supply units in an appropriate order, such as a serpentine order, a winding order, a diagonal order, or a waterfall-like order, to start or stop applying voltage to corresponding zones sequentially. By chucking and releasing a wafer in a gradual and smooth fashion, the wafer will not be scratched by the chuck, consequently reducing the risk of particles generation.

Figure 12:
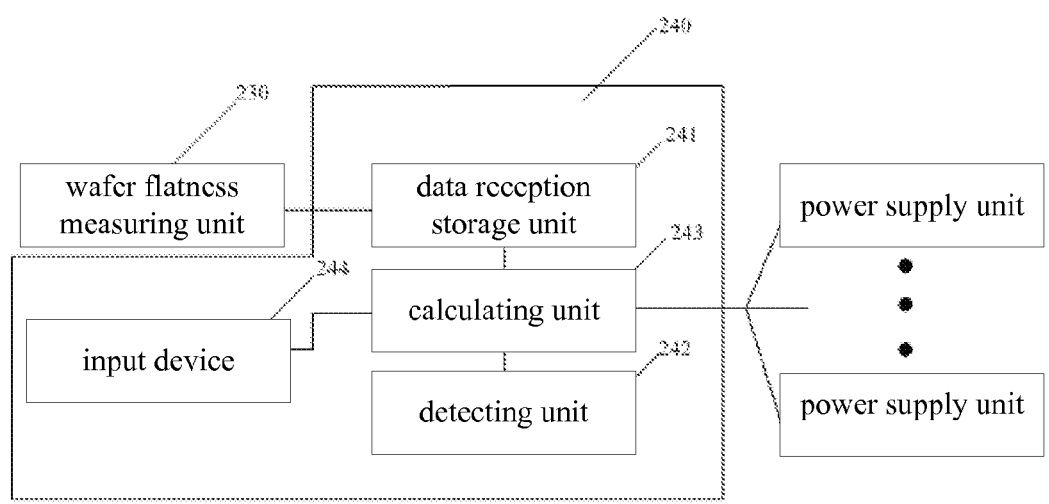
FIG. 12 is a schematic block view of a control unit of an in-situ monitored electrostatic chuck according to an embodiment of the present disclosure.

Referring to FIG. 12, control unit 240 includes a data reception and storage unit 241, a detecting unit 242, and a calculating unit 243. Data reception and storage unit 241 is configured to receive the flatness data of the wafer from wafer flatness measuring unit 230 and to store the flatness data. Data reception and storage unit 241 may be any suitable storage device, such as a hard disk, a memory, or a flash memory.

Detecting unit 242 is connected to a semiconductor processing device which employs the wafer holding apparatus provided according to the embodiments of the present disclosure. The semiconductor processing device may be a plasma etching device, a PVD device, a CVD device, an ALD device, an exposure device, a CMP device, and the like. Detecting unit 242 is connected to one of the semiconductor processing devices mentioned above, so as to obtain data of a semiconductor fabrication process. If the semiconductor fabrication process indicates to release the wafer, detecting unit 242 transmits a release signal to calculating unit 243. Detecting unit 242 may be an optical detector, a Bluetooth transceiver, or an infrared transceiver.

Calculating unit 243 is configured to receive the release signal from detecting unit 242, and to select a power supply mode for each power supply unit to reduce the intensity of the supplied power based on the flatness data stored in data reception and storage unit 241, so that the wafer held by the electrostatic chuck may be released smoothly.

It should be noted that data reception and storage unit 241 may store multiple power supply modes to reduce the intensity of the supplied power in advance. After receiving the release signal, calculating unit 243 may select a suitable power supply mode among the pre-stored ones for each of the plurality of power supply units to reduce the intensity of the supplied power.

In addition, it should be noted that control unit 240 may further include an input device 244 which may be a touch screen, a mouse, a keyboard, or combinations thereof. A suitable power supply mode to reduce the intensity of supplied power may be set through input device 244, so that calculating unit 243 is controlled to select a power supply mode for each of the plurality of power supply units to reduce the intensity of power supply, whereby the wafer may be de-chucked by the electrostatic chuck smoothly and gradually.

The control unit according to the embodiments of the present disclosure may control each of the power supply units independently to reduce or stop applying voltage, and may select a power supply mode to reduce the intensity of the supplied power based on the wafer flatness data, whereby the wafer may be released by the electrostatic chuck smoothly.

The data reception and storage unit according to the embodiments of the present disclosure may store the flatness data of the wafer and transmit the flatness data to the control unit, so that the control unit may select a power supply mode which matches with the flatness data to reduce the intensity of power supply, which enables the electrostatic chuck to release the wafer smoothly, thereby reducing the risk of particle contamination.

Further, according to the embodiments of the present disclosure, multiple ways of reducing the intensity of power supply may be stored in the data reception and storage unit. Based on the flatness data of the wafer, the calculating unit may select a power supply mode to reduce the intensity of power supply, which enables the electrostatic chuck to release the wafer smoothly, thereby reducing the risk of particle contamination.

Figure 13:
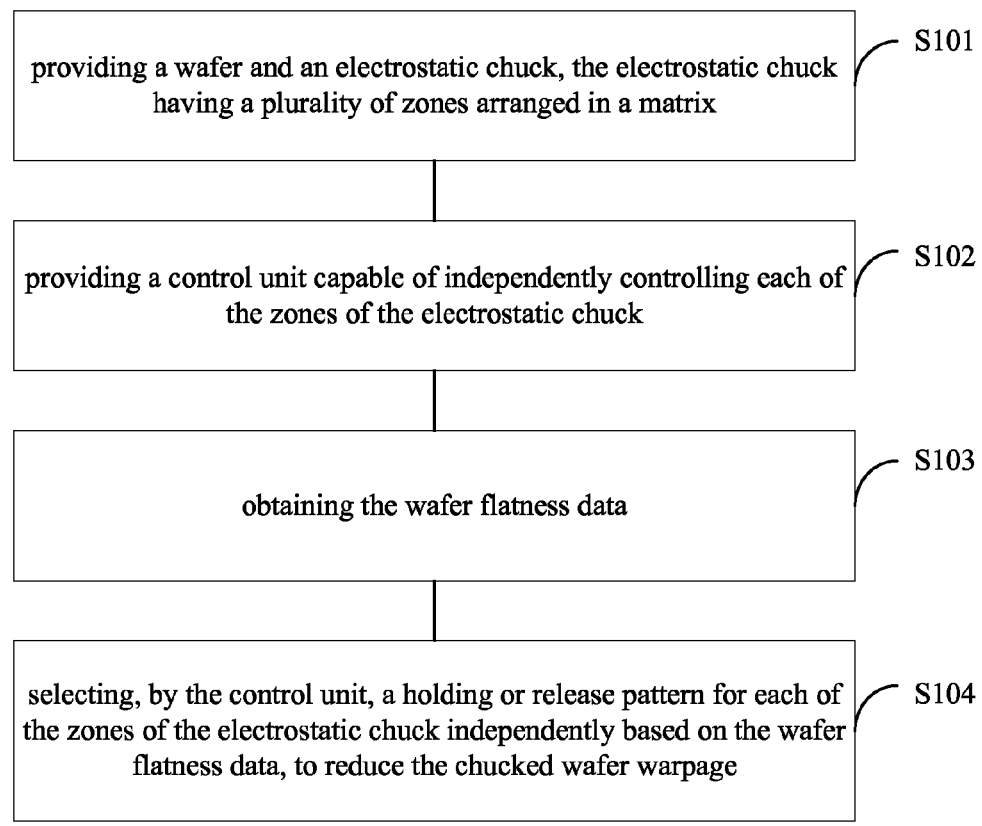
FIG. 13 is a flow chart of a method using of an in-situ monitored electrostatic chuck to flatten a wafer according to an embodiment of the present disclosure.

Another embodiment of the present disclosure provides a method for holding a wafer. Referring to FIG. 13, the method includes:

S101, providing a wafer, and providing an electrostatic chuck, the electrostatic chuck having a plurality of zones arranged in a matrix;

S102, providing a control unit capable of independently controlling each of the zones of the electrostatic chuck;

S103, obtaining the wafer flatness data; and

S104, selecting, by the control unit, a binding or release manner for each of the zones of the electrostatic chuck independently based on the wafer flatness data, to reduce the chucked wafer warpage.

Hereinafter, a method for holding a wafer according to this disclosure will be described with reference to specific embodiments.

Step 101 is performed to provide a wafer which is held by an electrostatic chuck. The electrostatic chuck has a plurality of zones arranged in a matrix.

Referring to FIG. 4, electrostatic chuck 201 includes a base, electrodes in the base, and an insulating layer. The base is configured to support the electrodes and the insulating layer. Being powered by the power supply units 212, the electrodes serve to generate Coulomb force or Johnsen-Rahbek force between the wafer and the electrodes in electrostatic chuck 201. The insulating layer forms a dielectric between the electrodes and the wafer.

As an example, electrostatic chuck 201 may have a circular shape slightly larger than the wafer. Optionally, electrostatic chuck 201 may have a square or rectangular shape, but the present disclosure is not limited thereto.

Electrostatic chuck 201 has a plurality of zones arranged in a matrix. For example, the electrostatic chuck has M×N zones arranged in a matrix, wherein M and N are natural numbers greater than 1.

If M=N, the chuck is a square. FIG. 5 shows an electrostatic chuck 301 which has 6×6 zones 302 arranged in a square matrix. A wafer 303 is placed on the surface of electrostatic chuck 301.

In another example, an electrostatic chuck 401 having a 9×9 matrix of zones 402 is shown in FIG. 6, and the total 81 zones 402 constitute the electrostatic chuck. A wafer 403 is placed on the surface of electrostatic chuck 401.

It should be noted that the more zones an electrostatic chuck has, typically the better chucking effect the chuck can achieve. First a better wafer flatness may be achieved. Secondly, the wafer may be chucked and de-chucked by the electrostatic chuck more smoothly.

In addition, the electrostatic chuck may have various zones arranged in a matrix, such as 7×9, 8×11, 15×17, 2×2, 27×9, 38×41, 25×17 and 12×45. The size of each zone may be the same or different. Optionally, the size of each zone in the matrix may be configured based on the typical wafer warpage resulting from process, so that a desired effect of holding the wafer by the electrostatic chuck will be achieved.

The wafer is held by electrostatic chuck 201 and is processed (e.g. deposition, etch, or photolithographic) by a semiconductor processing device. It should be noted that the wafer size can be 300 mm, 450 mm, or even larger. Semiconductor devices are formed on the surface of the wafer.

Step 102 is performed to provide a control unit to independently control each of the plurality of zones of the electrostatic chuck.

The control unit may refer to that in the above-described embodiments of the wafer holding apparatus.

Referring to FIG. 12, control unit 240 includes a data reception and storage unit 241, a detecting unit 242, and a calculating unit 243. Data reception and storage unit 241 is configured to receive the flatness data of the wafer from wafer flatness measuring unit 230 and store the flatness data. Data reception and storage unit 241 may be any suitable storage device, such as a hard disk, a memory, or a flash memory.

Detecting unit 242 is connected to a semiconductor processing device which employs the wafer holding apparatus provided according to the embodiments of the present disclosure. The semiconductor processing device may be a plasma etching device, a PVD device, a CVD device, an ALD device, an exposure device, a CMP device, and the like. Detecting unit 242 is connected to one of the semiconductor processing devices mentioned above, so as to obtain data of a semiconductor fabrication process. If the semiconductor fabrication process indicates to release the wafer, detecting unit 242 transmits a release signal to calculating unit 243. Detecting unit 242 may be an optical detector, a Bluetooth transceiver, or an infrared transceiver.

Calculating unit 243 is configured to receive the release signal from detecting unit 242, and to select a power supply mode for each power supply unit to reduce the intensity of the supplied power based on the flatness data stored in data reception and storage unit 241, so that the wafer held by the electrostatic chuck may be released smoothly.

It should be noted that data reception and storage unit 241 may store multiple power supply modes to reduce the intensity of the supplied power in advance. After receiving the release signal, calculating unit 243 may select a suitable power supply mode among the pre-stored ones for each of the plurality of power supply units to reduce the intensity of the supplied power.

In addition, it should be noted that control unit 240 may further include an input device 244 which may be a touch screen, a mouse, a keyboard, or combinations thereof. A suitable power supply mode to reduce the intensity of supplied power may be set through input device 244, so that calculating unit 243 is controlled to select a power supply mode for each of the plurality of power supply units to reduce the intensity of power supply, whereby the wafer may be de-chucked by the electrostatic chuck smoothly.

Step 103 is performed to obtain the wafer flatness data.

The wafer flatness data can be obtained through the wafer flatness measuring unit of the wafer holding apparatus according to the embodiment of the disclosure described above. The wafer flatness measuring unit may be an optical scanning device, a stress monitor device, or an optical interferometer.

For example, a wafer flatness measuring unit includes an optical scanning unit, a receiver, and a processor. The scanning unit scans the wafer loaded on the electrostatic chuck. The scanning unit may be a digital camera, a high-precision scanner, a high-precision camera. Hereinafter, the optical interferometer may be used as an example. The optical interferometer measures the wafer front surface, thus the chucked wafer flatness data can be received by the processor.

A digital camera, a high-precision scanner, or an optical interferometer may be employed as the scanning unit, the scanning unit acquires position data of the wafer loaded on the electrostatic chuck and transmits the position data to the processor. The position data reflects the flatness of the loaded wafer.

Step 104 is performed to select, by the control unit, a holding or release pattern for each of the zones of the electrostatic chuck independently, based on the wafer flatness data, to reduce the chucked wafer warpage.

As an example, based on the wafer flatness data, the control unit may select a holding or release pattern which matches with the wafer flatness for each of the plurality of zones of the electrostatic chuck to independently fix or release the wafer.

The binding force for holding the wafer may be Coulomb force or Johnsen-Rahbek force generated between the wafer and the electrodes in the electrostatic chuck. Optionally, the binding force is generated by applying voltage to the electrodes by the power supply units.

As an example, referring to FIG. 8, the holding pattern for each of the zones of the electrostatic chuck is to start increasing voltage to corresponding zones 502 sequentially in a serpentine order, so that the electrostatic chuck holds the wafer tightly. Specifically, taking an electrostatic chuck 501 arranged in a 6×6 matrix as an example, the control unit controls each of the plurality of power supply units in a direction of AA' or A'A to start increasing voltage to 6×6 zones 502 sequentially. By doing this, the 6×6 zones 502 start generating binding force sequentially in a serpentine order, so that electrostatic chuck 501 holds wafer 503 tightly in a serpentine order.

Also referring to FIG. 8, the release pattern for each of the zones of the electrostatic chuck is to reduce or stop applying voltage to corresponding zones 502 sequentially in a serpentine order, so that the electrostatic chuck releases the wafer accordingly. Specifically, taking an electrostatic chuck 501 arranged in a 6×6 matrix as an example, the control unit controls each power supply unit in either direction of AA' or A'A to reduce or stop applying voltage to 6×6 zones 502 sequentially. By doing this, 6×6 zones 502 stop generating binding force sequentially in a serpentine order, so that electrostatic chuck 501 releases wafer 503 in a serpentine order.

As another example, referring to FIG. 9, the holding pattern for each of the zones of the electrostatic chuck is to start increasing voltage to corresponding zones 602 sequentially in a winding order, so that the electrostatic chuck holds the wafer tightly. Specifically, taking an electrostatic chuck 601 arranged in a 6×6 matrix as an example, the control unit controls each power supply unit in a direction of BB' or B'B to start increasing voltage to 6×6 zones 602 sequentially. By doing this, the 6×6 zones 602 start generating binding force sequentially in the winding order, so that electrostatic chuck 601 holds wafer 603 tightly in the winding order.

Also referring to FIG. 9, the release pattern for each of the zones of the electrostatic chuck is to reduce or stop applying voltage to corresponding zones 602 sequentially in a winding order, so that the electrostatic chuck releases the wafer accordingly. Specifically, taking an electrostatic chuck 601 arranged in a 6×6 matrix as an example, the control unit controls each power supply unit in the direction of BB' or B'B to reduce or stop applying voltage to 6×6 zones 602 sequentially. By doing this, 6×6 zones 602 stop generating binding force sequentially in a winding order, so that electrostatic chuck 601 releases wafer 603 in a winding order.

As another example, referring to FIG. 10, the holding pattern for each of the zones of the electrostatic chuck is to start increasing voltage to corresponding zones 702 sequentially in a diagonal order starting from one corner of the chuck, so that the electrostatic chuck holds the wafer tightly. Specifically, taking an electrostatic chuck 701 arranged in a 6×6 matrix as an example, the control unit controls each power supply unit in a direction of CC' or C'C to start increasing voltage to 6×6 zones 702 sequentially. By doing this, 6×6 zones 702 start generating binding force sequentially in the diagonal order, so that electrostatic chuck 701 holds wafer 703 tightly in the diagonal order.

Similarly, referring to FIG. 10, the release manner for each of the zones of the electrostatic chuck is to reduce or stop applying voltage to corresponding zones 702 sequentially in a diagonal order, so that the electrostatic chuck releases the wafer. Specifically, taking an electrostatic chuck 701 arranged in a 6×6 matrix as an example, the control unit controls each power supply unit in either direction of CC' or C'C to reduce or stop applying voltage to 6×6 zones 702 sequentially. By doing this, 6×6 zones 702 stop generating binding force sequentially in a diagonal order, so that electrostatic chuck 701 releases wafer 703 in a diagonal order.

Referring to FIG. 11, the holding pattern for each of the zones of the electrostatic chuck is to start increasing voltage to corresponding zones 802 sequentially in a waterfall-like order, so that the electrostatic chuck holds the wafer tightly. Specifically, taking an electrostatic chuck 801 arranged in a 6×6 matrix as an example, the control unit controls each power supply unit in a direction of DD' or D'D to start increasing voltage to 6×6 zones 802 sequentially. By doing this, 6×6 zones 802 start generating binding force sequentially in the waterfall-like order, so that the electrostatic chuck 801 holds wafer 803 tightly in the waterfall-like order.

Also referring to FIG. 11, the release pattern for each of the zones of the electrostatic chuck is to reduce or stop applying voltage to corresponding zones 802 sequentially in a waterfall-like order, so that the electrostatic chuck releases the wafer. Specifically, taking an electrostatic chuck having 6×6 zones 802 arranged in a matrix as an example, the control unit controls each power supply unit in either direction of DD' or D'D to reduce or stop applying voltage to 6×6 zones 802 sequentially. By doing this, 6×6 zones 802 stop generating binding force sequentially in the waterfall-like order, so that electrostatic chuck 801 releases wafer 803 in the waterfall-like order.

It should be noted that after the wafer flatness data is obtained, a release or holding pattern can be selected independently for each zone of the electrostatic chuck to hold or release the wafer based on the flatness data.

In one embodiment, different ways may be used to reduce the intensity of the supplied power on different zones of the electrostatic chuck, such as in a gradient descending way, in a linear descending way, and in a curved descending way. That is, the way to reduce intensity of the supplied power can be determined flexibly according to the wafer flatness, so as to reduce the risk of particle contamination in the course of de-chucking.

The method for holding a wafer according to the embodiments of the present disclosure can select a release pattern for the plurality of zones to release the wafer held by the electrostatic chuck based on the wafer flatness. Consequently, instead of being released by the plurality of zones simultaneously, the wafer may be released smoothly, thereby avoiding particle contamination which may be generated when the wafer gets back into warpage from flatness instantaneously.

Although the present disclosure has been described with reference to specific embodiments, it should be understood that the disclosure is presented for examples only, and is not intended to be limiting. Those skilled in the art can modify and vary the embodiments without departing from the spirit and scope of the present disclosure.

What is claimed is:

1. A wafer holding apparatus, comprising:
   an electrostatic chuck, the electrostatic chuck having a plurality of zones arranged in a matrix;
   a plurality of power supply units, each adapted to sequentially apply a voltage to a corresponding one of the plurality of zones of the electrostatic chuck independently, wherein the plurality of zones has M×N zones arranged in the matrix, and M and N are natural numbers greater than 1; and
   a control unit adapted to control each of the plurality of power supply units independently to independently start or stop applying the voltage to a corresponding zone of the electrostatic chuck.

2. The wafer holding apparatus according to claim 1, wherein the starting voltage is increased gradually or in steps.

3. The wafer holding apparatus according to claim 1, wherein the stopping voltage is applied gradually or in steps.

4. The wafer holding apparatus according to claim 1, wherein the control unit is configured to control each of the plurality of power supply units in a winding order through the corresponding zones sequentially.

5. The wafer holding apparatus according to claim 1, wherein the control unit is configured to control each of the plurality of power supply units in a winding order to stop applying the voltage to the corresponding zones sequentially.

6. The wafer holding apparatus according to claim 1, wherein the control unit is configured to control each of the plurality of power supply units in a serpentine order through the corresponding zones sequentially.

7. The wafer holding apparatus according to claim 1, wherein the control unit is configured to control each of the plurality of power supply units in the serpentine order to stop applying the voltage to the corresponding zones sequentially.

8. The wafer holding apparatus according to claim 1, wherein the control unit is configured to control each of the plurality of power supply units in a diagonal order to start or stop applying the voltage to the corresponding zone sequentially.

9. The wafer holding apparatus according to claim 1, wherein the control unit is configured to control each of the plurality of power supply units in a waterfall-like order to start or stop applying the voltage to the corresponding zone sequentially.

10. The wafer holding apparatus according to claim 1, further comprising a wafer flatness measuring unit configured to measure the chucked wafer flatness data.

11. The wafer holding apparatus according to claim 10, wherein the wafer flatness measuring unit comprises an optical scanning device, a wafer stress monitor device, or an optical interferometer.

12. The wafer holding apparatus according to claim 11, wherein the control unit is configured to control each of the plurality of power supply units independently based on the wafer flatness data.

13. The wafer holding apparatus according to claim 1, wherein the control unit comprises:
  a data reception and storage unit adapted to receive and store wafer flatness data;
  a detecting unit coupled to a semiconductor processing device and adapted to obtain data of a semiconductor fabrication process, and to transmit a release signal if the semiconductor fabrication process indicates to release the wafer; and
  a calculating unit adapted to receive the release signal from the detecting unit, and to select a power supply mode for each of the plurality of power supply units to reduce intensity of the supplied power based on the flatness data stored in the data reception and storage unit, so that the wafer held by the electrostatic chuck is released smoothly.

14. A method for holding a wafer, comprising:
  providing a wafer;
  providing an electrostatic chuck, the electrostatic chuck having a plurality of zones arranged in a matrix;
  providing a control unit capable of independently and sequentially controlling each of the zones of the electrostatic chuck, wherein the plurality of zones has M×N zones arranged in the matrix, and M and N are natural numbers greater than 1;
  obtaining the wafer flatness data; and
  selecting, by the control unit, one of a holding pattern and a release pattern for the zones of the electrostatic chuck independently based on the wafer flatness data so as to reduce the chucked wafer warpage.

15. The method according to claim 14, wherein selecting the holding pattern for the plurality of zones of the electrostatic chuck independently further includes: applying the voltage to the corresponding zones sequentially in a winding, a serpentine, a diagonal, or a waterfall-like order.

* * * * *